United States Patent
Kim et al.

(10) Patent No.: US 9,991,312 B1
(45) Date of Patent: Jun. 5, 2018

(54) ELECTROLUMINESCENCE DISPLAY APPARATUS AND MANUFACTURING METHOD THEREOF

(71) Applicant: LG Display Co., Ltd., Seoul (KR)

(72) Inventors: JungChul Kim, Gyeonggi-do (KR); JunYoung Kwon, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/623,863

(22) Filed: Jun. 15, 2017

(30) Foreign Application Priority Data

Dec. 29, 2016 (KR) ........................ 10-2016-0182953

(51) Int. Cl.
*H01L 27/12* (2006.01)
*H01L 27/15* (2006.01)
*H01L 27/32* (2006.01)

(52) U.S. Cl.
CPC ........ *H01L 27/156* (2013.01); *H01L 27/1222* (2013.01); *H01L 27/1274* (2013.01); *H01L 27/3262* (2013.01)

(58) Field of Classification Search
CPC ........ H01L 27/1222–27/1233; H01L 27/1296; H01L 27/3262
See application file for complete search history.

(56) References Cited

U.S. PATENT DOCUMENTS

| | | | |
|---|---|---|---|
| 2002/0000576 A1* | 1/2002 | Inukai | G09G 3/3266 257/202 |
| 2003/0183857 A1* | 10/2003 | Korenari | H01L 29/78696 257/288 |
| 2007/0085847 A1 | 4/2007 | Shishido | |
| 2007/0287297 A1* | 12/2007 | Kikuchi | H01L 21/3065 438/719 |
| 2009/0250701 A1* | 10/2009 | Kimura | H01L 29/66757 257/72 |
| 2012/0282741 A1 | 11/2012 | Mori et al. | |
| 2014/0361290 A1 | 12/2014 | Yamazaki et al. | |

OTHER PUBLICATIONS

Extended European Search Report dated Jan. 23, 2018, issued in corresponding European Application No. 17180533.6.

* cited by examiner

*Primary Examiner* — Bryan Junge
(74) *Attorney, Agent, or Firm* — Morgan, Lewis & Bockius LLP

(57) ABSTRACT

An electroluminescence display device and manufacturing method thereof are provided. An electroluminescence display device includes a pixel, having: an electroluminescence diode, a driving transistor configured to supply a current to the electroluminescence diode, and a switching transistor configured to switch a signal supplied to the driving transistor, wherein a size of a channel area of the driving transistor is different from a size of a channel area of the switching transistor, and wherein a taper angle deviation of the channel areas of the driving transistor and the switching transistor is less than or equal to 10°.

15 Claims, 9 Drawing Sheets

ELECTROLUMINESCENCE DISPLAY APPARATUS AND MANUFACTURING METHOD THEREOF

CROSS-REFERENCE TO RELATED APPLICATION(S)

This application claims the priority of Korean Application No. 10-2016-0182953, filed on Dec. 29, 2016, the entirety of which is hereby incorporated by reference.

BACKGROUND

1. Technical Field

The present disclosure relates to a display device and, more particularly, to an electroluminescence display device and manufacturing method thereof.

2. Discussion of the Related Art

An electroluminescence element, which is a self-emissive element, includes an anode electrode, a cathode electrode, and an electroluminescence layer formed there between. The electroluminescence layer includes a hole transport layer (HTL), an emission layer (EML), and an electron transport layer (ETL). When voltages are applied to the anode electrode and the cathode electrode, an exciton is generated by combining a hole passed through the hole transport layer (HTL) and an electron passed through the electron transport layer (ETL), whereby a visible light is emitted at the emission layer (EML). An active matrix type electroluminescence display device, including a matrix of self-emissive electroluminescence elements, is advantageous in terms of fast response speed, emission efficiency, brightness and wide viewing angle characteristics. For these reasons, the electroluminescence display device is widely used.

A plurality of pixels (P) of the electroluminescence display device arranged in a matrix, each respectively including an electroluminescence diode (ELD), which controls the brightness of the plurality of pixels according to the gray level of the video data. Each pixel further includes a driving transistor that controls a driving current supplied to the electroluminescence diode according to the potential difference between the gate electrode and the source electrode of the driving transistor and at least one switch transistor that programs the potential difference between the gate electrode and the source electrode of the driving transistor. The driving current is determined according to the potential difference between the gate electrode and the source electrode of the driving transistor and the threshold voltage of the driving transistor. The brightness of the pixel is proportional to the amount of the driving current supplied the electroluminescence diode.

Accordingly, the potential difference between gate and the source electrode of the driving transistor should be maintained in an accurate and stable manner for displaying the pixel with a desired brightness value. However, for various reasons, there may be unwanted deviations with respect to voltages at each electrode.

For example, threshold voltage ($V_{th}$) deviation of the transistor may exist. Further, gate lines, emission lines, and data lines may generate parasitic capacitance with any neighboring electrodes. As a result, when gate signals, emission signals, and data signals are changed, a kickback voltage may be generated at the neighboring electrodes. At that time, the kickback voltage may be generated in an uneven manner according to the positional relationship with respect to the neighboring electrodes where the kickback voltage is generated.

There have been attempts to compensate such threshold voltage deviation ($\Delta V_{th}$) by implementing internal compensation circuit or external compensation circuit techniques.

SUMMARY

Accordingly, the present disclosure is directed to electroluminescence display apparatus and manufacturing method thereof that substantially obviate one or more of the issues due to limitations and disadvantages of the related art.

An aspect of the present disclosure is to provide an electroluminescence display device including a pixel that includes a driving transistor and a switching transistor with different channel area sizes with reduced taper angle deviation.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, an electroluminescence display device may include: a pixel, including: an electroluminescence diode, a driving transistor configured to supply a current to the electroluminescence diode, and a switching transistor configured to switch a signal supplied to the driving transistor, wherein a size of a channel area of the driving transistor is different from a size of a channel area of the switching transistor, and wherein a taper angle deviation of the channel areas of the driving transistor and the switching transistor is less than or equal to 10°.

Furthermore, in a manufacturing method of an electroluminescence display device, the method may include: providing a semiconductor layer on a substrate, patterning a photoresist on the semiconductor layer by a photolithography process, and patterning a taper angle of channel areas of a driving transistor and a taper angle of channel areas of a switching transistor by a dry etching process with at least 30% of oxygen ($O_2$) gas flow rate, wherein the channel areas of the driving transistor and the channel areas of the switching transistor both include the semiconductor layer, and wherein the taper angles are equal to or less than a particular degree.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Figure 1:
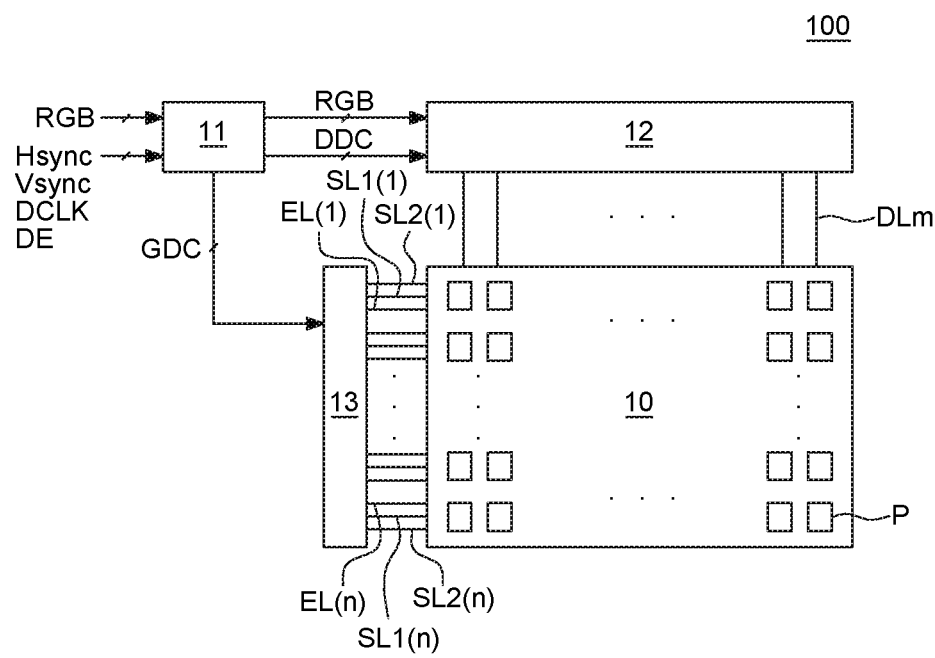
FIG. 1 is a diagram illustrating an electroluminescence display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Although the transistors of the embodiments of the present disclosure are illustrated as a P-type but the technical concept of the present disclosure is not limited thereto and the transistors can be realized as an N-type.

The inventor of the present disclosure researched a structure and manufacturing method for an electroluminescence display device, which is capable of providing a superior image quality.

In particular, the inventor of the present disclosure recognized that deviations in taper angles of the channel areas of the plurality of transistors of the pixels of the electroluminescence display device affect the image quality of electroluminescence display device. Further, it is recognized that the taper angle tends to vary according to the size of the channel area of transistors. In other words, it is discovered that as the size of the channel area becomes smaller, the angle of the taper becomes larger. Also it is discovered that as the size difference between the channel areas becomes larger, the taper angle deviation becomes larger.

Further, the inventor of the present disclosure recognized that a threshold voltage deviation of a transistor tends to increase as the taper angle deviation becomes larger. Consequently, a kickback voltage of a pixel becomes larger, whereby an image retention problem may be occurred.

Furthermore, the inventor of the present disclosure recognized that compensation performance of the conventional compensation circuits can be degraded when a threshold voltage deviation between a driving transistor and a switching transistor is in presence.

FIG. 1 is a diagram illustrating an electroluminescence display device according to an embodiment of the present disclosure.

With reference to FIG. 1, an electroluminescent display device 100 according to an example embodiment of the present disclosure is described. An electroluminescence display device 100 according to an embodiment of the present disclosure may include a display panel 10 on which a plurality of pixels P are formed, a data driver 12 for driving a plurality of data lines (DL(1) to DL(m)), a gate driver 13 for driving a plurality of gate lines, e.g., EL(1) to EL(n), SL1(1) to SL1($n$), and SL2(1) to SL2($n$), and a timing controller 11 for controlling the data driver 12 and the gate driver 13.

The plurality of pixels P at the display panel 10 may be arranged to display an image. The pixels P at an $n^{th}$ horizontal line may be electrically connected to $n^{th}$ emission line EL, an $n^{th}$ first scan line SL1, and an $n^{th}$ second scan line SL2. The pixel P in each column may be electrically connected to a corresponding data line DL, respectively. The transistors TFT configuring the pixel P may be formed of polycrystalline silicon (poly-Si).

The plurality of pixels P in the pixel area may be configured to receive a high potential voltage ELVDD, a low potential voltage ELVSS, and an initial voltage $V_{ini}$ from a power supply unit. The initialization voltage may be selected from a range that is sufficiently lower than the operating voltage of an electroluminescence diode ELD, whereby unnecessary emission of an electroluminescence diode ELD during an initialization period and a sampling period can be suppressed. That is, the initial voltage $V_{ini}$ may be set to be equal to or lower potential than the low potential voltage ELVSS. Accordingly, the initial voltage $V_{ini}$ may be lower than the low potential voltage ELVSS, whereby the lifetime of the electroluminescence diode ELD can be extended.

The timing controller 11 may rearrange the digital video data RGB received from an external system to be compatible to the resolution of the display panel 10, then may supply to the rearranged digital video data RGB the data driver 12. Further, the timing controller 11 may generate signals, such as a data control signal DDC for controlling the operating timing of the data driver 12 and a gate control signal GDC for controlling the operating timing of the gate driver 13, which may be generated based on timing signals, such as a vertical synchronization signal Vsync, a horizontal synchronization signal Hsync, a dot clock signal DCLK, and a data enable signal DE.

The data driver 12 may convert the digital video data RGB received from the timing controller 11 into analog data voltages based on the data control signal DDC. The gate driver 13 may generate scan and emission signals based on the gate control signal GDC. The gate driver 13 may include a scan driver and an emission driver. The scan driver may supply a first scan signal SCAN1 to the first scan line SL1 and a second scan signal SCAN2 to the second scan line SL2. The emission driver may supply an emission signal EM to the emission line EL. Such gate driver 13 may be directly formed in the periphery area of the display panel 10, e.g., by a gate driver-in-panel (GIP) technique. However, embodiments of the present disclosure are not limited to the above-described elements, which are merely examples.

Figure 2:
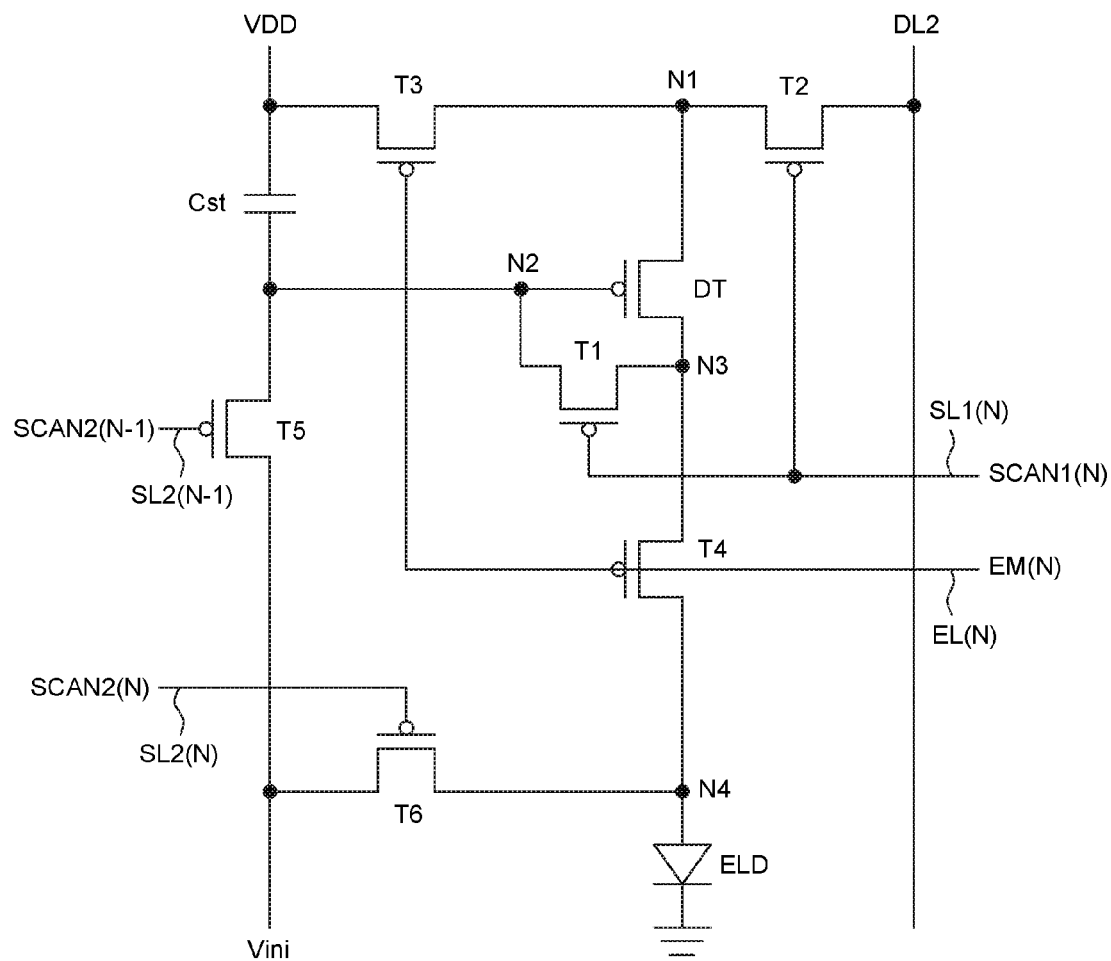
FIG. 2 is a circuit diagram illustrating a pixel of the display panel of FIG. 1.

FIG. 2 is a circuit diagram illustrating a pixel of a display panel of FIG. 1.

With reference to FIG. 2, the pixel P of the display panel 10 of the electroluminescence display device 100 according to an example embodiment of the present disclosure will be described. Each pixel P may include an electroluminescence diode ELD, a driving transistor DT, first to sixth transistors (T1 to T6), and a capacitor Cst. However, embodiments of the present disclosure are not limited to the above-described elements, which are merely examples. The first to sixth transistors (T1 to T6) may be referred to as "switching transistor ST."

The electroluminescence diode ELD may be emitted by a driving current supplied from the driving transistor DT. The electroluminescence diode ELD may include an anode electrode, a cathode electrode, and functional layers formed therebetween. The functional layers may include at least one layer among a hole transport layer (HTL), an electron transport layer (ETL), and an emission layer (EML).

The hole transport layer is a layer for injecting a hole or transporting a hole. For example, a hole injection layer (HIL), a hole transport layer (HTL), an electron blocking layer (EBL), etc. may be regarded as the "hole transport layer."

The electron transport layer is a layer for injecting an electron or transporting an electron from the cathode electrode or anode electrode to the EML. For example, an electron transport layer (ETL), an electron injection layer (HIL), a hole blocking layer (HBL), etc. may be regarded as the "electron transport layer."

The anode of the electroluminescence diode ELD may be connected to a fourth node N4. The cathode of the electroluminescence diode ELD may be connected to an input of the low potential voltage ELVSS, which may be a ground voltage.

The driving transistor DT may control the driving current supplied to the electroluminescence diode ELD according to the potential difference between a gate electrode and a source electrode thereof. With respect to the driving transistor DT, the source electrode thereof may be connected to a first node N1, the gate electrode thereof may be connected to a second node N2, and a drain electrode thereof may be connected to a third node N3.

The first transistor T1 may include a source electrode connected to the third node N3, a drain electrode connected to the second node N2, and a gate electrode connected to an $n^{th}$ first scan line SL1(N). In response to an $n^{th}$ first scan signal SCAN1(N), the first transistor T1 may have a diode connection which electrically shorts the gate electrode and the source electrode of the driving transistor DT to act as a diode.

The second transistor T2 may include a source electrode connected to a data line DL, e.g., DL2, a drain electrode connected to the first node N1, and a gate electrode connected to the $n^{th}$ first scan line SL1(N). As a result, in response to the first scan signal SCAN1(N), the second transistor T2 may supply a data voltage Vdata from the data line, e.g., data line DL2, to the first node N1.

The third transistor T3 may include a source electrode connected to a high potential line VDD, a drain electrode connected to the first node N1, and a gate electrode connected to an emission line EL(N). As a result, in response to the emission signal EM, e.g., emission signal EM(N), the third transistor T3 may supply a high potential voltage ELVDD, e.g., VDD, to the first node N1.

The fourth transistor T4 may include a source electrode connected to the third node N3, a drain electrode connected to the fourth node N4, and a gate electrode connected to the emission line EL(N). In response to the emission signal EM(N), the fourth transistor T4 may provide a current path between the third node N3 and the fourth node N4.

The fifth transistor T5 may include a drain electrode connected to the second node N2, a source electrode connected to an input of the initial voltage $V_{ini}$, and a gate electrode connected to an $(N-1)^{th}$ second scan line SL2(N−1). In response to the $(N-1)^{th}$ second scan signal SCAN2(N−1), the fifth transistor T5 may supply the initial voltage $V_{ini}$ to the second node N2.

The sixth transistor T6 may include a drain electrode connected to the fourth node N4, a source electrode connected to the input of the initial voltage $V_{ini}$, and a gate electrode connected to an $n^{th}$ second scan line SL2(N). In response to the $n^{th}$ second scan signal SCAN2(N), the sixth transistor T6 may supply the initial voltage $V_{ini}$ to the fourth node N4.

The storage capacitor Cst may include a first electrode connected to the second node N2 and a second electrode connected to the high voltage line VDD. Embodiments of the present disclosure are not limited to the above-described examples.

Figure 3:
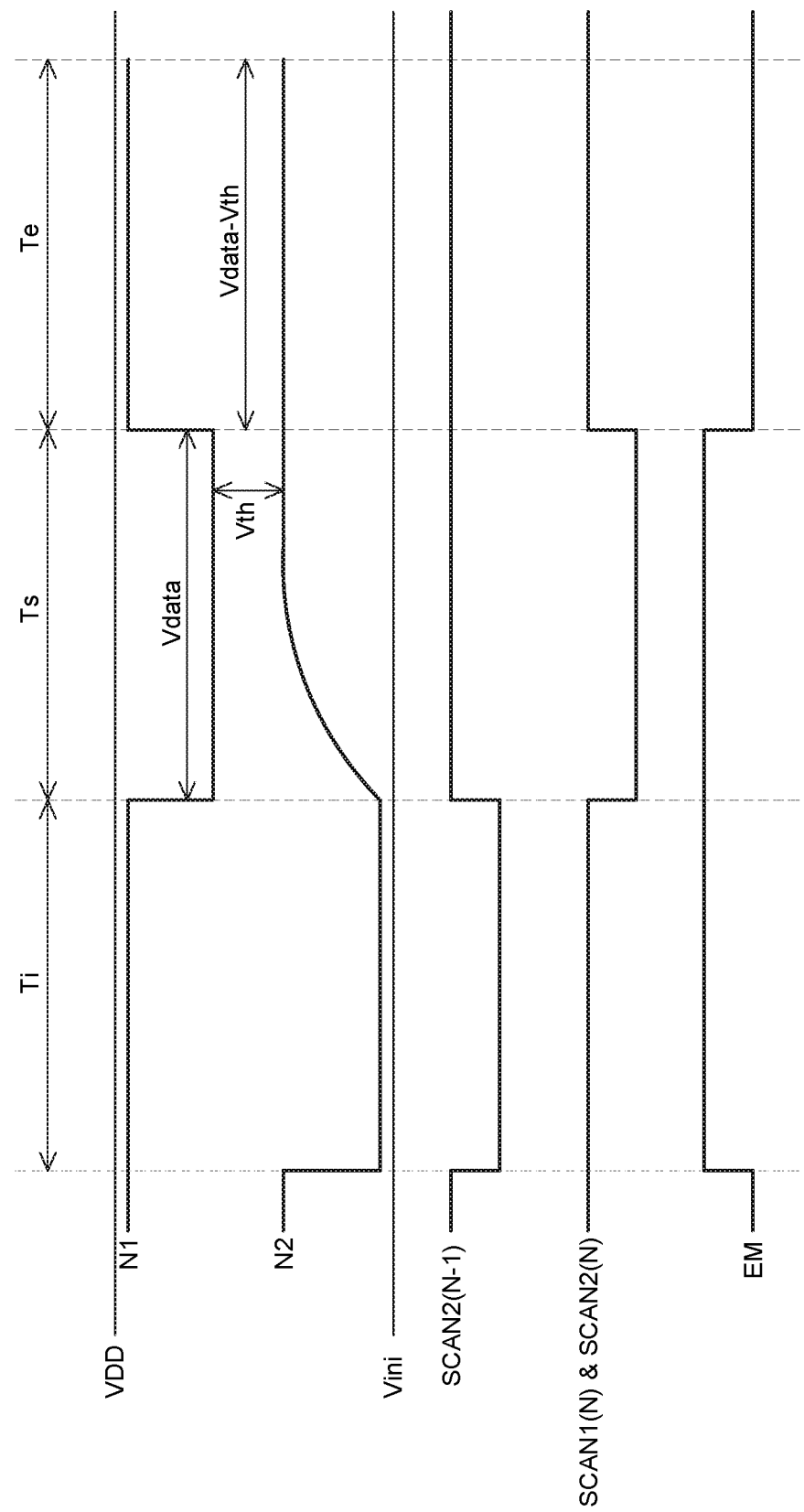
FIG. 3 is a schematic waveform graph illustrating scan signals for driving the pixel and corresponding node voltages of the pixel.
Figure 4A:
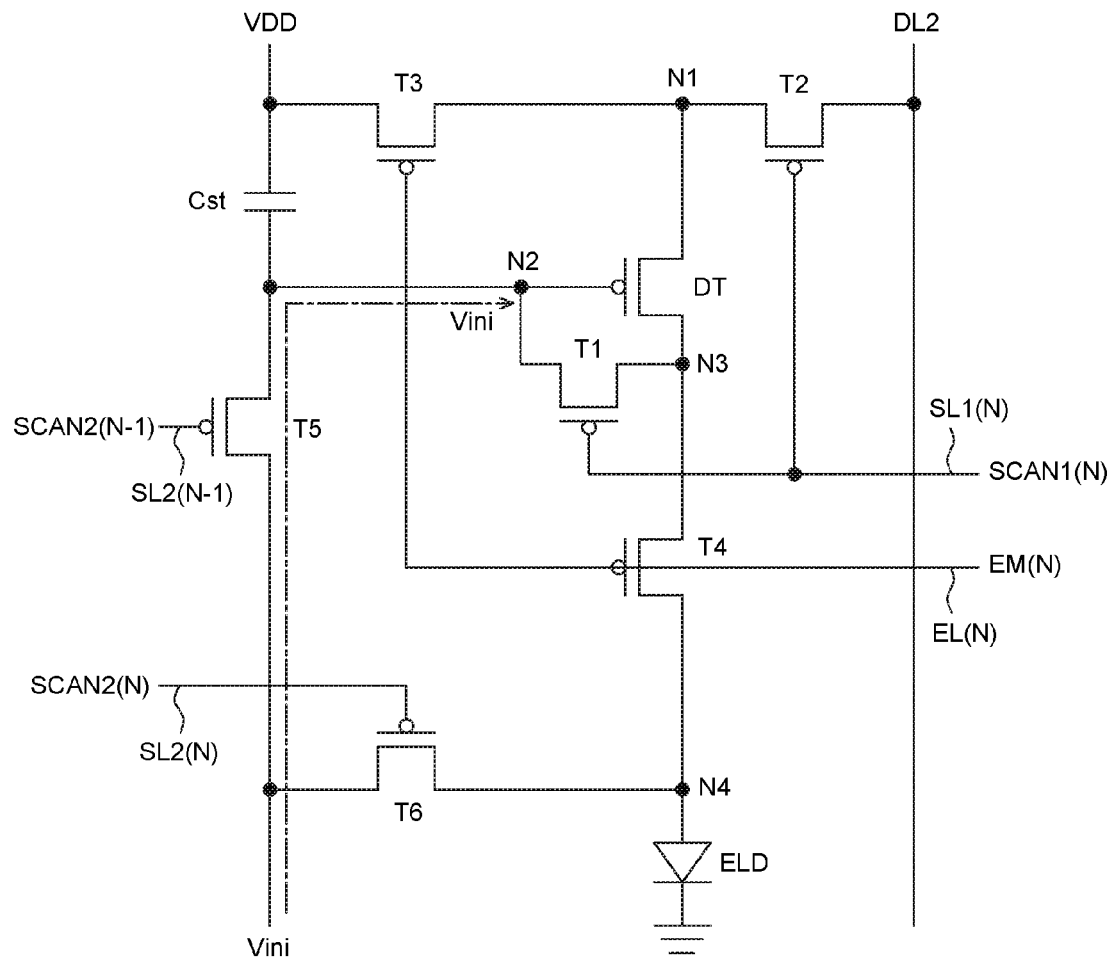
FIG. 4A is a circuit diagram of the pixel during an initialization period.
Figure 4B:
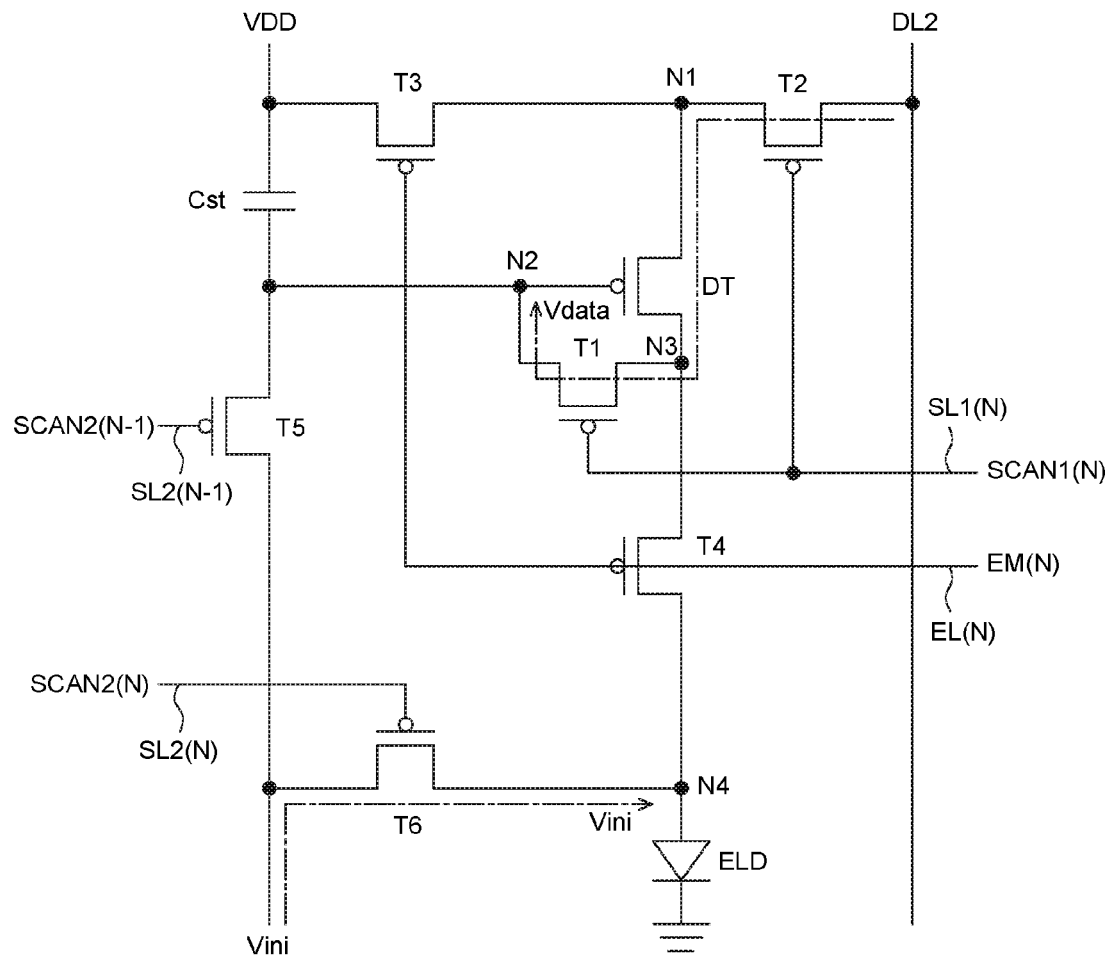
FIG. 4B is a circuit diagram of the pixel during a sampling period.
Figure 4C:
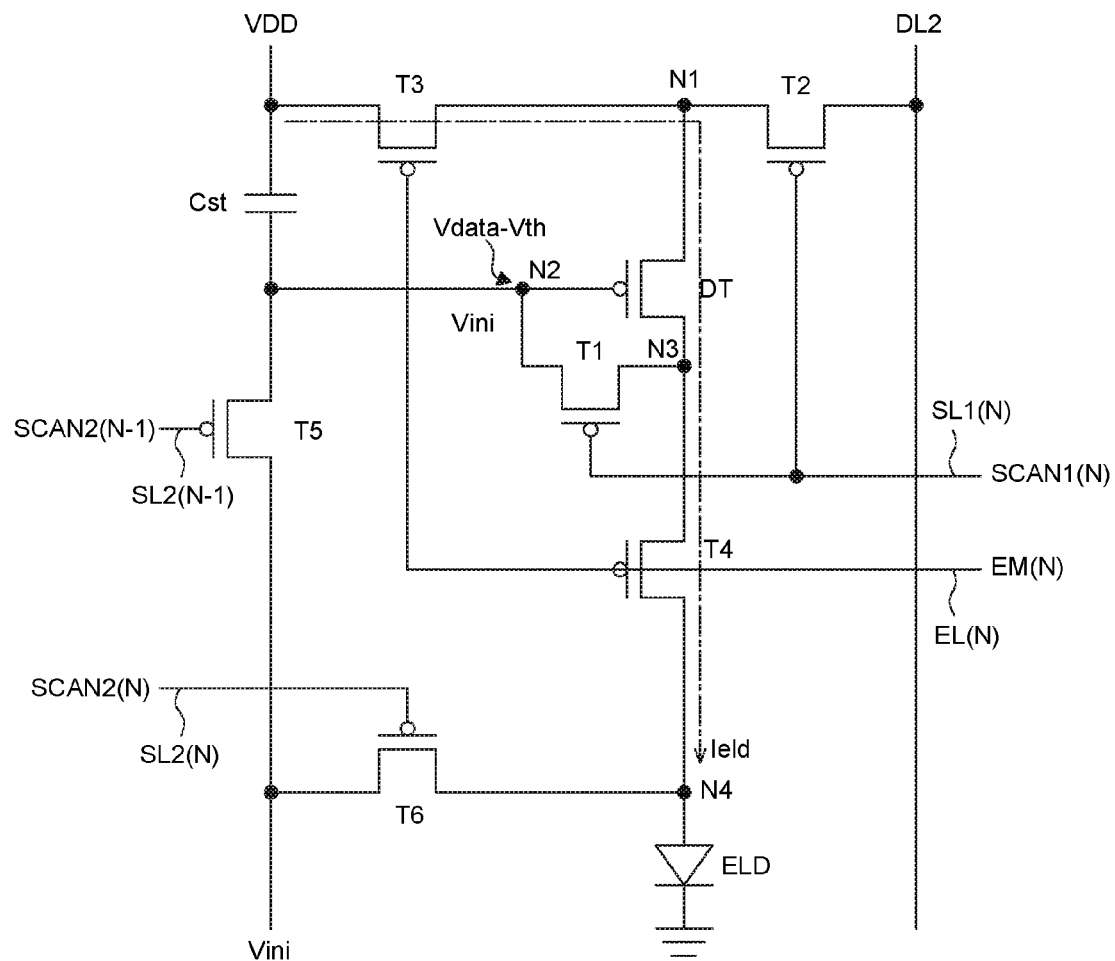
FIG. 4C is a circuit diagram of the pixel during an emission period.

FIG. 3 is a waveform graph illustrating scan signals for driving the pixel and corresponding node voltages of the pixel. FIG. 4A is a circuit diagram of the pixel P during an initialization period. FIG. 4B is a circuit diagram of the pixel P during a sampling period. FIG. 4C is a circuit diagram of the pixel during an emission period.

With reference to FIG. 2 to FIG. 4C, an operation of the electroluminescence display device 100 according to an example embodiment of the present disclosure will be described. In an electroluminescence display device 100 according to an example embodiment of the present disclosure, a frame period may be divided into an initial period $T_i$, a sampling period $T_s$, and an emission period $T_e$. However, embodiments of the present disclosure are not limited thereto.

The initial period $T_i$ is a period for initializing the gate electrode of the driving transistor. Sampling period $T_s$ is a period for sampling the threshold voltage $V_{th}$ of the driving transistor DT and storing the threshold voltage $V_{th}$ to the second node N2 after the initialization of the voltage of the anode electrode of the electroluminescence diode ELD. The emission period $T_e$ is a period for emitting the electroluminescence diode ELD by the driving current determined by the programmed potential difference between the gate electrode and the source electrode of the driving transistor DT, including the sampled threshold voltage $V_{th}$.

The initial period $T_i$ of the $n^{th}$ horizontal line may overlap with the sampling period $T_s$ of the $(N-1)^{th}$ horizontal line. That is, the sampling period $T_s$ may be sufficiently secured, whereby compensation of the threshold voltage $V_{th}$ can be more accurate. It should be noted that, as the threshold voltage deviation $(\Delta V_{th})$ of the switching transistor ST and the driving transistor DT increases, compensation accuracy of the threshold voltage $V_{th}$ may be degraded.

During the initial period $T_i$, in response to the $n^{th}$ second scan signal SCAN2(N), the fifth transistor T5 may apply the initial voltage $V_{ini}$ to the second node N2. Accordingly, the gate electrode of the driving transistor DT may be initialized to the initial voltage $V_{ini}$. The initial voltage $V_{ini}$ may be selected within a voltage range sufficiently lower than the operating voltage of the electroluminescence diode ELD, and can be set to a voltage equal to or lower than the low potential voltage ELVSS. During the initialization period $T_i$, the data voltage $V_{data}$ from the previous frame may be maintained in the first node N1.

During the sampling period $T_s$, in response to the $n^{th}$ second scan signal SCAN2(N), the sixth transistor T6 may supply the initial voltage $V_{ini}$ to the fourth node N4. As a result, the anode electrode of the electroluminescence diode ELD may be initialized to the initializing voltage $V_{ini}$.

In response to the $n^{th}$ first scan signal SCAN1(N), the second transistor T2 may supply the data voltage Vdata, which may be supplied from the data line DL1 to the first node N1. In response to the $n^{th}$ first scan signal SCAN1(N), the first transistor T1 may be turned on so that the driving transistor DT is in a diode connection mode.

During the sampling period $T_s$ a current may flow through the source electrode and the drain electrode of the driving transistor DT. As the gate electrode and the drain electrode of the driving transistor DT are in a diode connection mode, the voltage of the second node N2 may gradually rise due to the current flowing from the source electrode to the drain electrode. During the sampling period $T_s$, the voltage of the second node N2 may increase from the data voltage $V_{data}$, e.g., $V_{data(n)}$, up to a value of $(V_{data(n)}-V_{th})$ obtained by subtracting the threshold voltage $V_{th}$ of the driving transistor DT.

During the emission period $T_e$, in response to the emission signal EM, e.g., emission signal EM(N), the third transistor T3 may supply the high potential voltage VDD to the first node N1. In response to the $n^{th}$ emission signal EM(N), the fourth transistor T4 may form a current path between the third node N3 and the fourth node N4. Accordingly, the driving current $I_{eld}$ through the source electrode and the drain electrode of the driving transistor DT may be supplied to the electroluminescence diode ELD.

During the emission period $T_e$, a relational expression for the driving current $I_{eld}$ flowing through the electroluminescence diode ELD may be represented by the following Equation 1.

$$I_{eld}=(k/2)(V_{gs}+|V_{th}|)^2=(k/2)(V_g-V_s+|V_{th}|)^2=(k/2)(V_{data}-|V_{th}|-VDD+|V_{th}|)^2=(k/2)(V_{data}-VDD)^2$$ [Equation 1]

In Equation 1, (k/2) represents a proportional constant determined by electron mobility, parasitic capacitance, and a width (W) and a length (L) of the channel area of the driving transistor DT. The width of the channel region may be determined according to the width (W) and the length (L) of the channel region.

According to Equation 1, the threshold voltage $V_{th}$ component of the driving transistor DT may be cancelled in the relational expression of the driving current $I_{eld}$. This means that the drive current $I_{eld}$ may not change with respect to the electroluminescence display device according to an embodiment. That is, the data voltage of the electroluminescence display device according to an embodiment of the present disclosure can be programmed regardless of the deviations in the threshold voltage $V_{th}$ during the sampling period $T_s$.

However, during the sampling period $T_s$, even if the potential difference between the gate electrode and the source electrode of the driving transistor DT is programmed to a desired voltage, the target luminance may not be accomplished if the gate electrode voltage of the driving transistor DT varies. The gate electrode of the driving transistor DT may form a parasitic capacitance with the adjacent electrode or signal lines, and the voltage at the second node N2 can be varied due to a kickback effect caused by the parasitic capacitance. Change in voltage due to the parasitic capacitance at the second node N2 connected to the gate electrode of the driving transistor will now be described.

Figure 5:
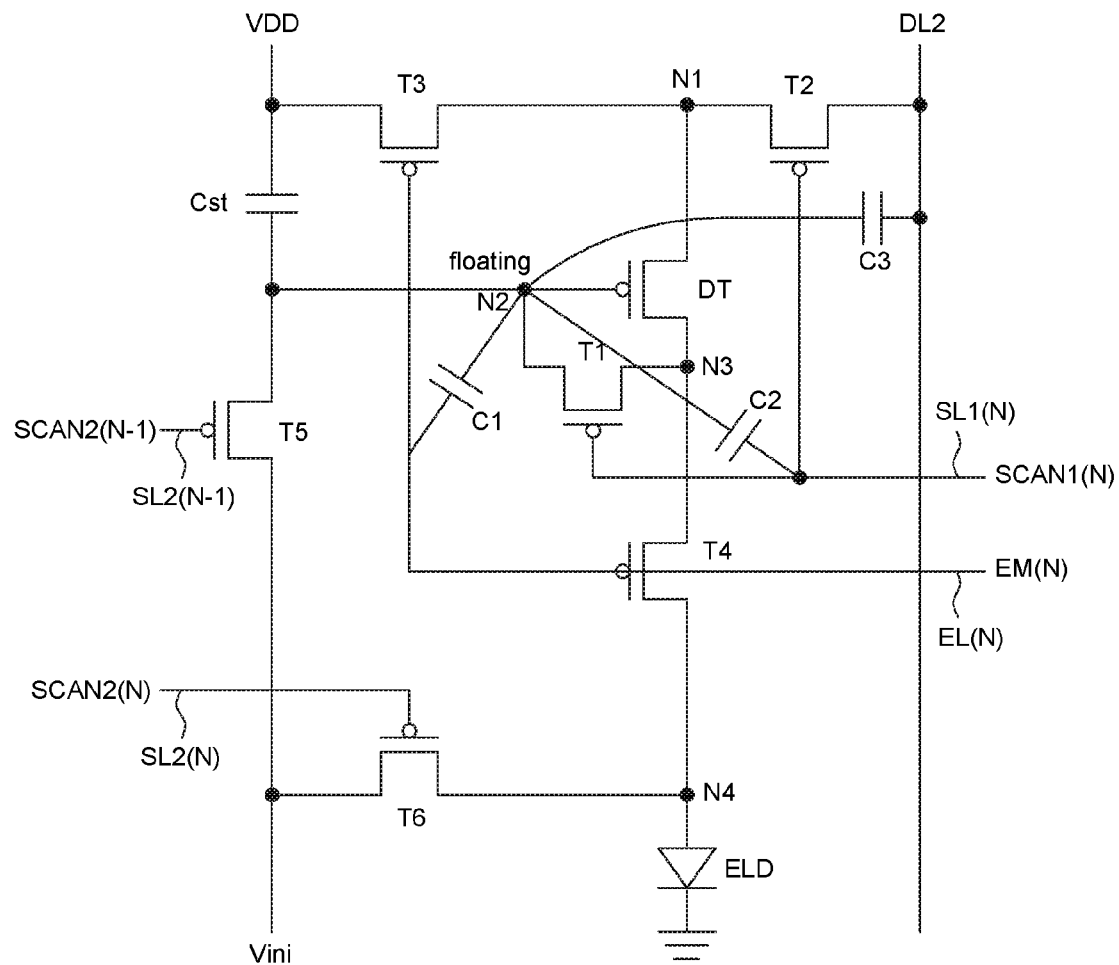
FIG. 5 is a circuit diagram illustrating parasitic capacitances generated by a gate electrode and another electrode (or a signal line) of a driving transistor at a transition time of the sampling period and the emission period.

FIG. 5 is a circuit diagram illustrating parasitic capacitances generated by a gate electrode and another electrode (or a signal line) of a driving transistor at a transition time of the sampling period and the emission period.

With reference to FIG. 5, a first parasitic capacitance C1 may be a capacitance between the second node N2 and the emission line EL(N), a second parasitic capacitance C2 may be a capacitance between the second node N2 and the first scan line SL1(N), and a third parasitic capacitance C3 may be a capacitance between the second node N2 and the data line DL, e.g., data line DL2.

With reference to FIG. 4B and FIG. 5, the second node N2 may be programmed to a value of $(V_{data}-V_{th})$ during the sampling period $T_s$, and the value $(V_{data}-V_{th})$ may be maintained under the floating state during the emission period $T_e$. However, the voltage at the second node N2 under the floating state can be affected by the parasitic capacitance. Therefore, when the voltage of the adjacent signal lines changes at the start of the emission period $T_e$, the voltage of the second node N2 may also change due to the kickback effect of each of the first to third parasitic capacitances C1 to C3. For example, as the threshold voltage deviation $(\Delta V_{th})$ between the threshold voltage of the switching transistor ST and the threshold voltage of the driving transistor DT increases, the kickback voltage may increase.

For example, at the start of the sampling period $T_s$, the emission signal EM may be inverted from a high potential voltage to a low potential voltage, and the first scan signal SCAN1(N) may be inverted from a low potential voltage to a high potential voltage. That is, the voltage at the electrode, which may be generating the parasitic capacitance with respect to the second node N2, may change, whereby the voltage of the second node N2 may be changed by the kickback effect. Hereinafter, the uniformity of the switching transistor ST (e.g., transistors T1 to T6) of the pixel P, according to the kickback voltage and the deviation in uniformity of the driving transistor DT will be described.

Figure 6A:
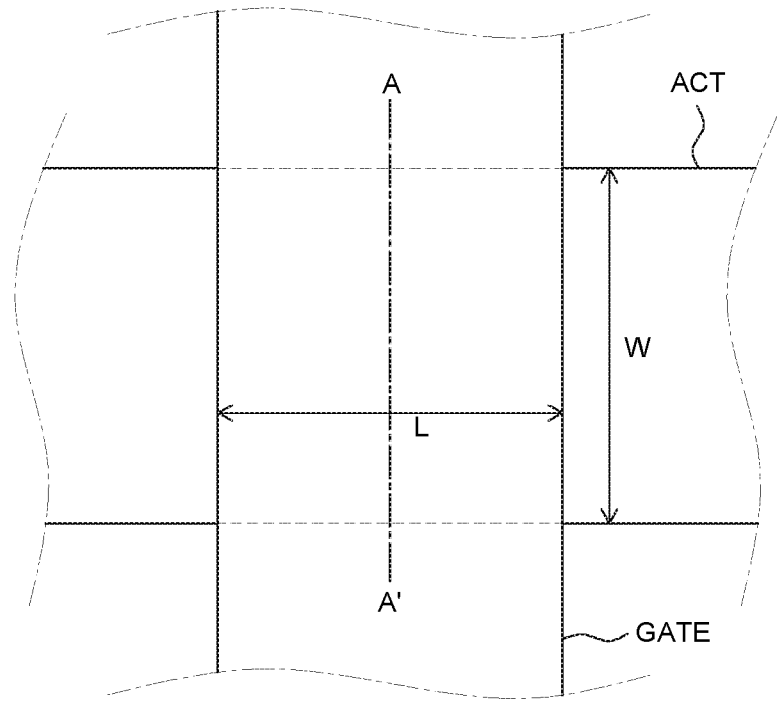
FIG. 6A is a plan view illustrating a driving transistor DT of the pixel of an electroluminescence display device according to an embodiment of the present disclosure.
Figure 6B:
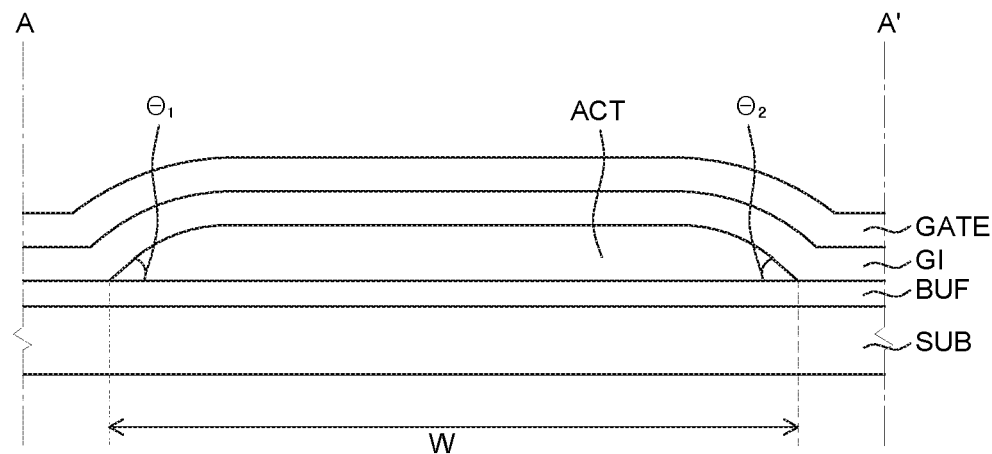
FIG. 6B is a cross-sectional view taken along line A-A' in FIG. 6A.
Figure 7A:
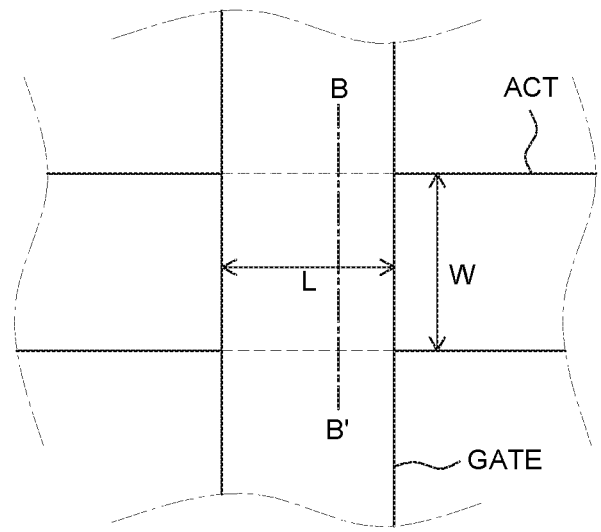
FIG. 7A is a plan view illustrating a switching transistor of a pixel of an electroluminescence display device according to an embodiment of the present disclosure.
Figure 7B:
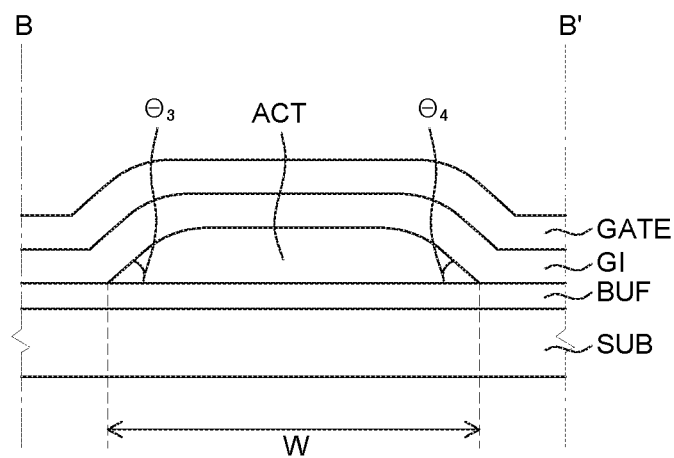
FIG. 7B is a cross-sectional view taken along line B-B' in FIG. 7A.

FIG. 6A is a plan view illustrating a driving transistor DT of the pixel P of an electroluminescence display device 100 according to an embodiment of the present disclosure. FIG. 6B is a cross-sectional view taken along line A-A' in FIG. 6A. FIG. 7A is a plan view illustrating a switching transistor ST of a pixel P of an electroluminescence display device 100 according to an embodiment of the present disclosure. FIG. 7B is a cross-sectional view taken along line B-B' in FIG. 7A.

With reference to FIG. 6A to FIG. 7B, a plurality of pixels P may be formed on the substrate SUB. The substrate SUB may be made, e.g., of glass or a flexible material. A buffer layer BUF may be formed on the substrate SUB. The buffer layer BUF may be formed, e.g., of silicon nitride ($SiN_x$) and/or silicon oxide ($SiO_x$), and may be formed as a single layer or a multilayer structure.

The semiconductor layer ACT of the transistors (e.g., DT and ST) of the pixel P according to an embodiment of the present disclosure may be formed, e.g., of low temperature polysilicon (LTPS), which may be crystalized by melting amorphous silicon (a-Si) by a laser. The crystallized semiconductor layer ACT may be superior in current driving ability as compared to the amorphous semiconductor layer. Therefore, the crystallized channel region can be relatively smaller as compared with the amorphous channel region. Thereby, a high-resolution display device can be realized. However, performance deviation may occur depending on the degree of crystallization of the channel region. That is, the crystallized semiconductor layer ACT may have a difficulty in securing the uniformity of the channel region characteristics in comparison with the amorphous semiconductor layer.

The semiconductor layer ACT may be deposited to a thickness of 300 Å to 700 Å, for example. A photoresist may be coated on the deposited semiconductor layer ACT. The photoresist may be patterned by a photolithography process. After the photolithography process, the semiconductor layer ACT may be patterned by a dry-etching process. The dry etching process may be performed by selectively using a gas, e.g., among $O_2$, methane ($CF_4$), sulfur hexafluoride ($SF_6$), helium (He), hydrochloric acid (HCl), chlorine gas ($Cl_2$), etc. $O_2$ gas may be used to adjust the taper angle of the semiconductor layer ACT. The portion of the semiconductor layer ACT from which the photoresist is removed may be etched by a dry etching process to form a channel region and a line region of each transistor. After the dry etching process, the photoresist can be removed by a stripping process. The semiconductor layer ACT of the electroluminescence display device 100 according to an example embodiment of the present disclosure may be patterned using, e.g., $CF_4$ gas and $O_2$ gas during the dry etching process as an example.

A gate insulating layer GI may be disposed on the semiconductor layer ACT. The gate insulating layer GI may be made, e.g., of silicon nitride ($SiN_x$) and/or silicon oxide ($SiO_x$), and may be formed as a single layer or a multilayer structure.

A gate electrode GATE may be disposed on the gate insulating layer GI. The gate electrode GATE and the semiconductor layer ACT may be electrically insulated by the gate insulating layer GI. The gate electrode GATE may be made, e.g., of a metallic material, and may be formed of a metallic material having low resistance, such as copper (Cu), aluminum (Al), molybdenum (Mo), and/or titanium (Ti). However, embodiments of the present disclosure are not limited thereto.

In addition, a region in which the semiconductor layer ACT and the gate electrode GATE overlap each other in the respective transistors can be defined as a "channel region." The region excluding the channel region in the semiconductor layer (ACT) can be defined as a "line region." One side of the line region can be referred to as a "source electrode" with respect to the channel region and the other side can be referred to as a "drain electrode." However, embodiments of the present disclosure are not limited thereto.

The line region of the semiconductor layer ACT may be referred to as a "metallized region" formed by inserting impurities (e.g., dopant) into the semiconductor layer ACT. The channel region of the semiconductor layer ACT may be shielded from the impurities, e.g., by using a mask. For example, the gate electrode GATE overlapping the channel region may function as a mask for blocking impurities. However, embodiments of the present disclosure are not limited thereto. For example, the region where impurity is doped may be defined by using a separate mask. The impurity supply process may be referred to as a "doping process."

The line region of the semiconductor layer ACT may become conductive by a high concentration doping process. The impurity supplied to the line region of the semiconductor layer ACT may be doped, e.g., with a group 3 boron (B) which is an acceptor and/or a group 5 phosphorus (P) which is a donor. However, embodiments of the present disclosure are not limited to the above-mentioned substances.

In addition, the channel region of the semiconductor layer ACT may be doped with a low concentration of acceptor, thereby the channel region may be a P-type. In this case, the transistor becomes a PMOS transistor. In addition, the channel region of the semiconductor layer ACT may be doped with a low concentration of donor, thereby the channel region may be an N-type. In this case, the transistor becomes an NMOS transistor. Signal levels and source-drain identifications and connections may be adjusted as would be understood by one of ordinary skill in the art based on the transistor type.

As the line region of the semiconductor layer ACT of a particular transistor among the transistors of the pixel P has a metallic characteristic, the line region can be further extended to be a portion of a signal line and/or a node. That is, the line region, which may be doped with a high concentration, interconnecting the channel regions of the different transistors in the pixel P, may be formed as a connection line and/or a node. Further, a portion of the line region may be configured to be electrically connected to a metal signal line (e.g., a data line) connected through a contact hole passing through an insulating layer.

The width W and the length L of the semiconductor layer ACT of each of the transistors of the pixel P may be variously formed. The shape of the channel region of each of the transistors is not limited to the square shape of the FIG. 6A example. For example, the channel region may be formed in various shapes, such as an "S" shape, an "L" shape, a "C" shape, and a curved shape. Further, the width W of the channel region may be differently formed depending on the specific position.

The performance of the transistor may be determined by the length L and the width W of the channel region of the transistor. The width W and the length L of the channel region should be formed of an appropriate size to supply sufficient current $I_{eld}$ by the driving transistor DT to the electroluminescence diode ELD.

The width W and the length L of the channel region of the switching transistor ST may be made relatively less than the channel region of the driving transistor DT. Accordingly, the channel region of the switching transistor ST may be configured to be relatively smaller than channel region of the driving transistor DT. That is, the area of the channel region of the driving transistor can be wider than the area of the channel region of the switching transistor.

It should be noted that, if the dry etching process is performed without concerning the taper angle characteristics for different channel region areas of the transistors, the respective taper angles of the semiconductor layer ACT may vary according to the different channel region areas of the transistors. That is, to adjust the taper angles of the electroluminescence display device 100, there may be an operation performed for providing a semiconductor layer ACT on a substrate SUB, an operation performed for patterning a photoresist on the semiconductor layer by a photolithography process, and an operation performed for applying at least 30% of an $O_2$ gas flow rate for a dry etching process for patterning the taper angles of the channel regions of the driving transistor DT and the switching transistor ST having the semiconductor layer ACT, wherein the taper angles may be formed to be equal to or less than a particular angle.

With reference to Table 1 below, the taper angles of the semiconductor layer ACT of each transistor of the pixel P may vary depending on the ratio of the gas applied in the dry etching process. For example, when the semiconductor layer ACT is dry etched, the taper angle (θ) of the edge of the semiconductor layer ACT can be adjusted by controlling the ratio of the $CF_4$ gas and the $O_2$ gas. In Table 1, "$O_2$" denotes a content (e.g., percentage) of the $O_2$ gas among the $O_2$ gas and the $CF_4$ gas. "(θ1)" denotes a taper angle of one side of the channel region of the driving transistor DT. "(θ2)" denotes the taper angle of the other side of the channel region of the driving transistor DT. "(θ3)" denotes a taper angle of one side of the channel region of the switching transistor ST. "(θ4)" denotes the taper angle of the other side of the channel region of the switching transistor ST.

As an example, the width W of the channel region of the driving transistor DT may be 5 μm and the length L may be 20 μm. As an example, the width W of the channel region of the switching transistor ST may be 3 μm and the length L may be 3 μm. That is, the areas of the channel regions of the driving transistor DT and the switching transistor ST may be different from each other.

With further reference to Table 1, as the flow rate ratio of $O_2$ gas increases, the overall taper angles of the transistor having a different channel region area may be reduced. That is, the taper angle of the semiconductor layer can be adjusted according to the ratio of the $O_2$ gas.

TABLE 1

| $O_2$ | DT(θ$_1$) | DT(θ$_2$) | ST(θ$_3$) | ST(θ$_4$) |
|---|---|---|---|---|
| 30% | 14° | 13° | 28° | 26° |
| 40% | 10° | 9° | 18° | 183° |
| 50% | 6° | 6° | 7° | 7.5° |

The threshold voltage deviation ($\Delta V_{th}$) of each transistor and the image retention due to the kickback voltage according to the taper angle deviation (Δθ) of the respective transistors having different channel region areas will be described with reference to Table 2 below.

"|Δθ(DT-ST)|" of Table 2 denotes an absolute value taper angle deviation of the driving transistor DT and the switching transistor ST in which the area of the channel regions are different from each other. "|$\Delta V_{th}$(DT-ST)|" denotes an absolute value threshold voltage deviation of the driving transistor DT and the switching transistor ST according to |Δθ(DT-ST)|. "Image Retention" denotes a duration of an image being maintained according to |Δθ(DT-ST)|.

With reference to Table 2, as the taper angle deviation |Δθ(DT-ST)| of transistors having different channel area areas is reduced, the threshold voltage deviation |$\Delta V_{th}$(DT-ST)| and the kickback voltage may be reduced. Therefore, when the electroluminescence display device 100 displays an image, the image retention characteristic can be improved. With further reference to Table 1 above, it is disclosed that as the $O_2$ gas flow rate ratio increases, the taper angle deviation |Δθ(DT-ST)| may decrease, regardless of the area of the channel region of each transistor.

TABLE 2

| |Δθ$_{(DT-ST)}$| | |$\Delta V_{th(DT-ST)}$| | Image Retention |
|---|---|---|
| 1° | 0.05 V | 0 Seconds |
| 5° | 0.7 V | 20 Seconds |
| 10° | 1.1 V | 50 Seconds |
| 15° | 1.2 V | 60 Seconds |

That is, with further reference to Table 2, for example, a pixel P may include an electroluminescence diode ELD, a driving transistor DT configured to supply a current to the electroluminescence diode, and a switching transistor ST configured to switch a signal supplied to the driving transistor, wherein the area of the channel region of the driving transistor DT and the area of the channel region of the switching transistor ST may be different from each other, and wherein the taper angle deviation of the channel regions of the driving transistor DT and the switching transistor ST |Δθ(DT-ST)| may be less than or equal to 10°.

In one example, the taper angle deviation of the channel regions of the driving transistor DT and the switching transistor ST |Δθ(DT-ST)| may be less than or equal to 5°. In another example, the taper angle deviation of the channel regions of the driving transistor DT and the switching transistor ST |Δθ(DT-ST)| may be less than or equal to 1°.

In one example, to achieve the taper angle deviation of the channel regions of the driving transistor DT and the switching transistor ST |Δθ(DT-ST)| to be less than or equal to 10°, the $O_2$ gas flow rate may be at least 30%. In another example, to achieve the taper angle deviation of the channel regions of the driving transistor DT and the switching transistor ST |Δθ(DT-ST)| to be less than or equal to 5°, the $O_2$ gas flow rate may be at least 40%.

In another example, to achieve the taper angle deviation of the channel regions of the driving transistor DT and the switching transistor ST |Δθ(DT-ST)| to be less than or equal to 1°, the $O_2$ gas flow rate may be at least 50%. For example, the $O_2$ gas flow rate may be set from 50% to 60%. That is, according to the dry etching process, the pixel P of the electroluminescence display device 100 according to an embodiment of the present disclosure may include a plurality of transistors having different areas for the channel regions, and the taper angle deviation of the channel regions can be minimized.

Also, according to the above-described configurations, there may be an advantage in that the threshold voltage deviations ($\Delta V_{th}$) of the transistors of the plurality of pixels P in the pixel area can be reduced. Further, according to the above-described configurations, there may be an advantage in that the image retention characteristic can be improved. Further, because the threshold voltage deviation may be reduced, there may be an advantage in that the luminance uniformity of the pixel area can be improved.

Some example embodiments of the present disclosure can also be described as follows. According to an aspect of the present disclosure, an electroluminescence display device may include a pixel including an electroluminescence diode, a driving transistor configured to supply a current to the electroluminescence diode, and a switching transistor configured to switch a signal supplied to the driving transistor. A size of a channel area of the driving transistor may be different from a size of a channel area of the switching transistor. A taper angle deviation of the channel areas of the driving transistor and the switching transistor may be less than or equal to 10°.

The taper angle deviation of the channel areas of the driving transistor and the switching transistors may be adjusted according to an $O_2$ gas flow rate during a dry etching process. The taper angle deviation may be less than or equal to 5°. The channel areas of the driving transistor and the switching transistor may be dry etched with the $O_2$ gas flow rate greater than or equal to 40%. The taper angle deviation may be less than or equal to 1°. The channel areas of the driving transistor and the switching transistor may be dry etched with the $O_2$ gas flow rate greater than or equal to 50%. A taper angle of the channel areas of the driving transistor and a taper angle of the channel areas of the switch transistor may be respectively less than or equal to 20°. The taper angle of the channel areas of the driving transistor and the taper angle of the channel areas of the switch transistor may be respectively less than or equal to 10°. The taper angle deviation of the channel areas of the driving transistor and the switching transistor may be less than or equal to 5°. The size of the channel area of the driving transistor may be larger than the size of the channel area of the switching transistor. A semiconductor layer, configuring the driving transistor and the switching transistor, includes a low-temperature polysilicon layer.

According to another aspect of the present disclosure, a manufacturing method of an electroluminescence display device may include providing a semiconductor layer on a substrate, patterning a photoresist on the semiconductor layer by a photolithography process, and patterning a taper angle of channel areas of a driving transistor and a taper angle of channel areas of a switching transistor by a dry etching process with at least 30% of $O_2$ gas flow rate. Both of the channel areas of the driving transistor and of the switching transistor may include the semiconductor layer. The taper angles may be less than or equal to a particular degree. The semiconductor layer may be a low-temperature polysilicon layer which may be crystalized by a laser.

The particular degree may be less than or equal to 20°. The particular degree may be less than or equal to 10°. The $O_2$ gas flow rate may be greater than or equal to 50%. A mixture of gas used for the dry etching process may include the $O_2$ gas and at least one gas among $CF_4$, $SF_6$, He, HCl, and $Cl_2$.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An electroluminescence display device, comprising:
    a pixel, comprising:
        an electroluminescence diode;
        a driving transistor configured to supply a current to the electroluminescence diode; and
        a switching transistor configured to switch a signal supplied to the driving transistor,
        wherein a size of a channel area of the driving transistor is different from a size of a channel area of the switching transistor, and
        wherein a taper angle deviation of the channel areas of the driving transistor and the switching transistor is less than or equal to 10°.

2. The electroluminescence display device of claim 1, wherein the taper angle deviation is less than or equal to 5°.

3. The electroluminescence display device of claim 1, wherein the taper angle deviation is less than or equal to 1°.

4. The electroluminescence display device of claim 1, wherein a taper angle of the channel areas of the driving transistor and a taper angle of the channel areas of the switch transistor are respectively less than or equal to 20°.

5. The electroluminescence display device of claim 4, wherein the taper angle of the channel areas of the driving transistor and the taper angle of the channel areas of the switch transistor are respectively less than or equal to 10°.

6. The electroluminescence display device of claim 5, wherein the taper angle deviation of the channel areas of the driving transistor and the switching transistor is less than or equal to 5°.

7. The electroluminescence display device of claim 1, wherein the size of the channel area of the driving transistor is larger than the size of the channel area of the switching transistor.

8. The electroluminescence display device of claim 1, further comprising a semiconductor layer on which the driving transistor and the switching transistor are disposed, the semiconductor layer including a low-temperature polysilicon layer.

9. A manufacturing method of an electroluminescence display device, the method comprising:
    providing a semiconductor layer on a substrate;
    patterning a photoresist on the semiconductor layer by a photolithography process; and
    patterning a taper angle of channel areas of a driving transistor and a taper angle of channel areas of a switching transistor by a dry etching process with at least 30% of $O_2$ gas flow rate,
    wherein the channel areas of the driving transistor and the channel areas of the switching transistor both include the semiconductor layer,
    wherein the taper angles are equal to or less than a particular degree, and
    wherein a taper angle deviation of the channel areas of the driving transistor and the switching transistor is less than or equal to 10°.

10. The manufacturing method of claim 9, wherein the semiconductor layer is a low-temperature polysilicon layer that is crystalized by a laser.

11. The manufacturing method of claim 9, wherein the particular degree is less than or equal to 20°.

12. The manufacturing method of claim 11, wherein:
    the particular degree is less than or equal to 10°; and
    the $O_2$ gas flow rate is greater than or equal to 50%.

13. The manufacturing method of claim 9, wherein a mixture of gas used for the dry etching process includes the $O_2$ gas and at least one gas among $CF_4$, $SF_6$, He, HCl, and $Cl_2$.

14. The manufacturing method of claim 9, wherein a taper angle deviation is less than or equal to 5°.

15. The manufacturing method of claim 14, wherein the channel areas of the driving transistor and the switching transistor are dry etched with the $O_2$ gas flow rate equal to or more than 40%.

* * * * *